(12) United States Patent
Wakatsuki et al.

(10) Patent No.: US 11,004,804 B2
(45) Date of Patent: May 11, 2021

(54) SEMICONDUCTOR DEVICE AND METHOD OF MANUFACTURING THE SAME

(71) Applicant: TOSHIBA MEMORY CORPORATION, Minato-ku (JP)

(72) Inventors: Satoshi Wakatsuki, Yokkaichi (JP); Masayuki Kitamura, Yokkaichi (JP); Atsuko Sakata, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/294,984

(22) Filed: Mar. 7, 2019

(65) Prior Publication Data

US 2020/0091088 A1 Mar. 19, 2020

(30) Foreign Application Priority Data

Sep. 18, 2018 (JP) .............................. JP2018-173608

(51) Int. Cl.
| | | |
|---|---|---|
| *H01L 23/00* | (2006.01) | |
| *H01L 27/11568* | (2017.01) | |
| *H01L 27/11521* | (2017.01) | |
| *H01L 29/06* | (2006.01) | |

(52) U.S. Cl.
CPC ...... *H01L 23/562* (2013.01); *H01L 27/11521* (2013.01); *H01L 27/11568* (2013.01); *H01L 29/0649* (2013.01)

(58) Field of Classification Search
CPC ....... H01L 23/562; H01L 23/02; H01L 23/28; H01L 29/0649; H01L 27/11568; H01L 27/11521; H01L 27/11578; H01L 27/11551
See application file for complete search history.

(56) References Cited

U.S. PATENT DOCUMENTS

| | | |
|---|---|---|
| 6,335,297 B1 | 1/2002 | Han et al. |
| 9,780,111 B2 | 10/2017 | Ishizaki et al. |
| 2008/0224317 A1* | 9/2008 | Machkaoutsan ............................ H01L 21/28518 257/754 |
| 2016/0035569 A1* | 2/2016 | Rumer ................ H01J 37/3408 438/584 |

(Continued)

FOREIGN PATENT DOCUMENTS

| | | |
|---|---|---|
| JP | 8-17762 | 1/1996 |
| JP | 2001-15754 | 1/2001 |
| JP | 2016-201407 | 12/2016 |

OTHER PUBLICATIONS

Sze, Semiconductor Devices, Physics and Technology, 2nd edition, p. 459 (Year: 1985).*

(Continued)

*Primary Examiner* — Galina G Yushina
(74) *Attorney, Agent, or Firm* — Oblon, McClelland, Maier & Neustadt, L.L.P.

(57) ABSTRACT

In one embodiment, a semiconductor device includes a substrate, and a plurality of insulating layers provided on the substrate. The device further includes a plurality of electrode layers provided on the substrate alternately with the plurality of insulating layers and including metal atoms and impurity atoms different from the metal atoms, lattice spacing between the metal atoms in the electrode layers being greater than lattice spacing between the metal atoms in an elemental substance of the metal atoms.

4 Claims, 8 Drawing Sheets

(56) References Cited

U.S. PATENT DOCUMENTS

2017/0278861 A1* 9/2017 Sonehara ............ H01L 27/1157
2018/0033646 A1* 2/2018 Sharangpani ......... H01L 21/311
2019/0172839 A1* 6/2019 Tokuda ............... H01L 29/7926

OTHER PUBLICATIONS

Davey. The Lattice Parameter and Density of Pure Tungsten, Phys. Rev. 26, p. 736 (Year: 1925).*
Ozsdolay et al. Cubic b-WN layers;; Surface and Coating Technology 204 (2016), 00. 98-107 (Year: 2016).*

* cited by examiner

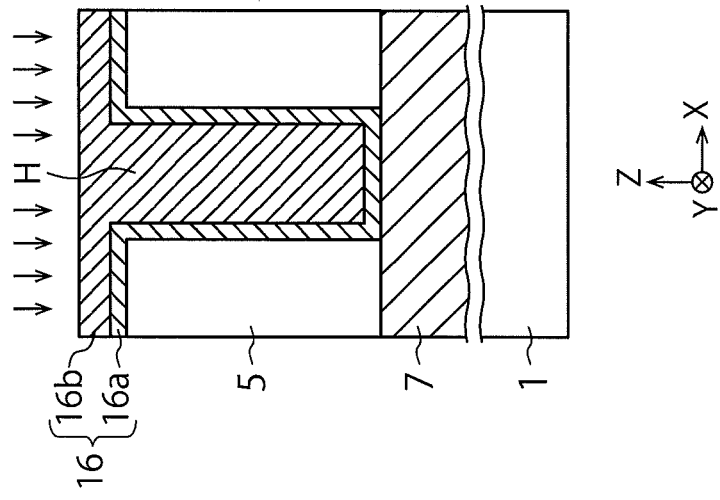
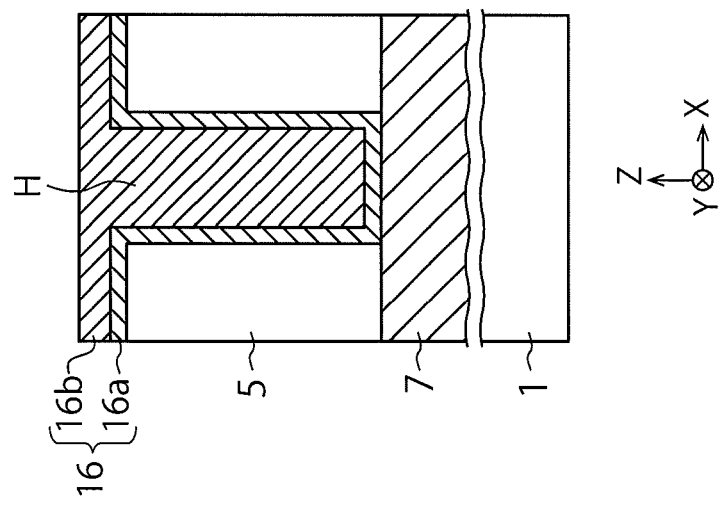
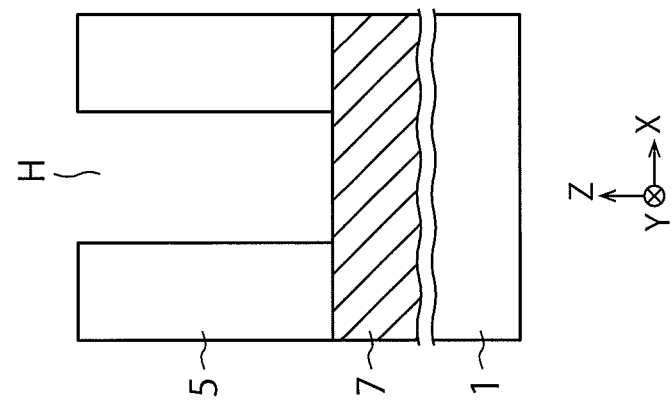

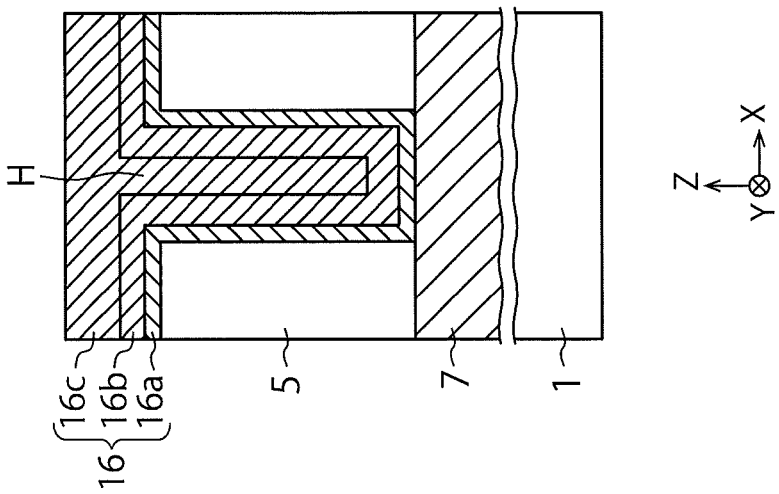
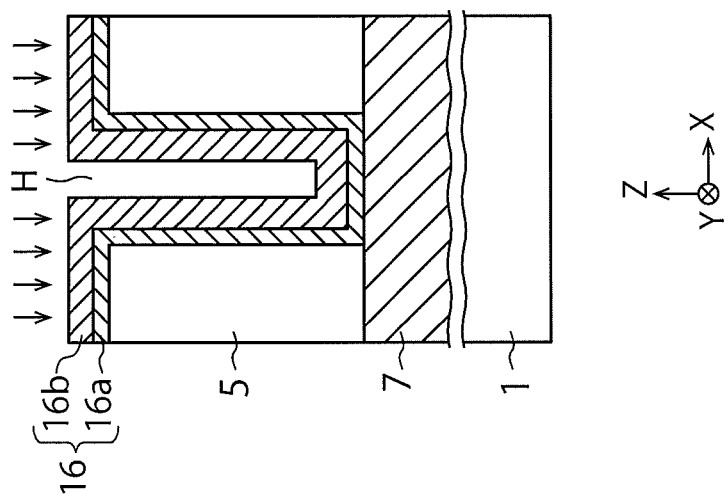
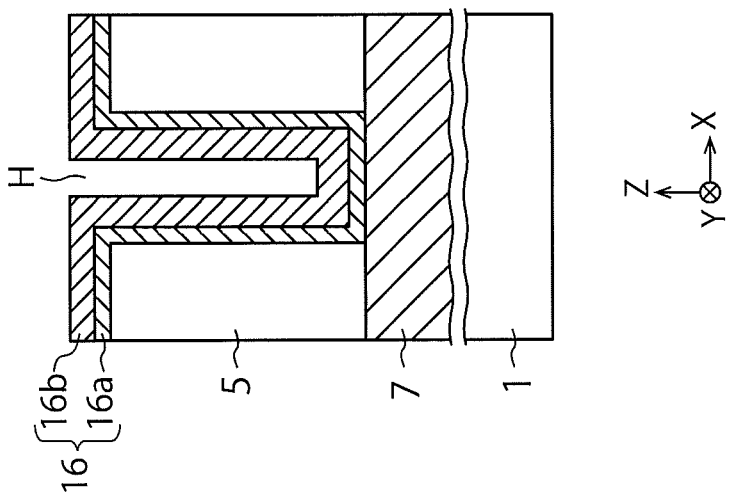

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2018-173608, filed on Sep. 18, 2018, the entire contents of which are incorporated herein by reference.

FIELD

Embodiments described herein relate to a semiconductor device and a method of manufacturing the same.

BACKGROUND

In a case where a concave portion is formed in a film on a substrate to form a metal layer in the concave portion, if a coefficient of linear expansion of the metal layer is greater than a coefficient of linear expansion of the film, the substrate may be warped into a downwardly convex shape. It is advisable to suppress such a warp of the substrate.

BRIEF DESCRIPTION OF THE DRAWINGS

FIGS. 9A to 9C are cross-sectional views illustrating a method of manufacturing a semiconductor device of a second embodiment; and FIGS. 10A to 10C are cross-sectional views illustrating a method of manufacturing a semiconductor device of a modification of the second embodiment.

DETAILED DESCRIPTION

Figure 1C:
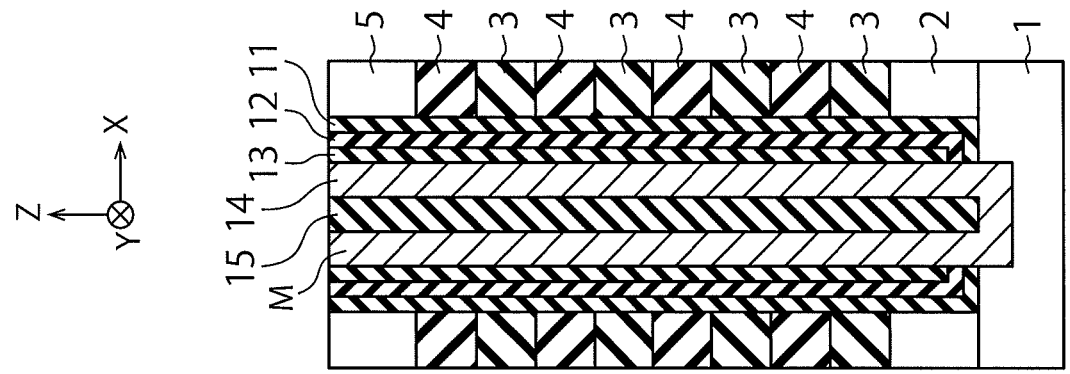
FIGS. 1A to 1C are cross-sectional views illustrating a method of manufacturing a semiconductor device of a first embodiment.

In one embodiment, a semiconductor device includes a substrate, and a plurality of insulating layers provided on the substrate. The device further includes a plurality of electrode layers provided on the substrate alternately with the plurality of insulating layers and including metal atoms and impurity atoms different from the metal atoms, lattice spacing between the metal atoms in the electrode layers being greater than lattice spacing between the metal atoms in an elemental substance of the metal atoms.

Embodiments will now be explained with reference to the accompanying drawings. The same reference numerals are used to designate the same or similar components throughout FIGS. 1A to 10C, and redundant descriptions thereof are omitted.

First Embodiment

Figure 1B:
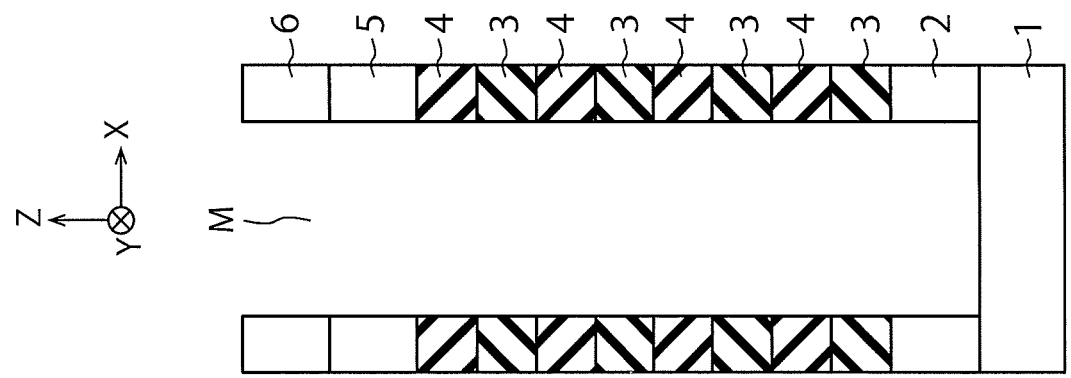
Figure 1A:
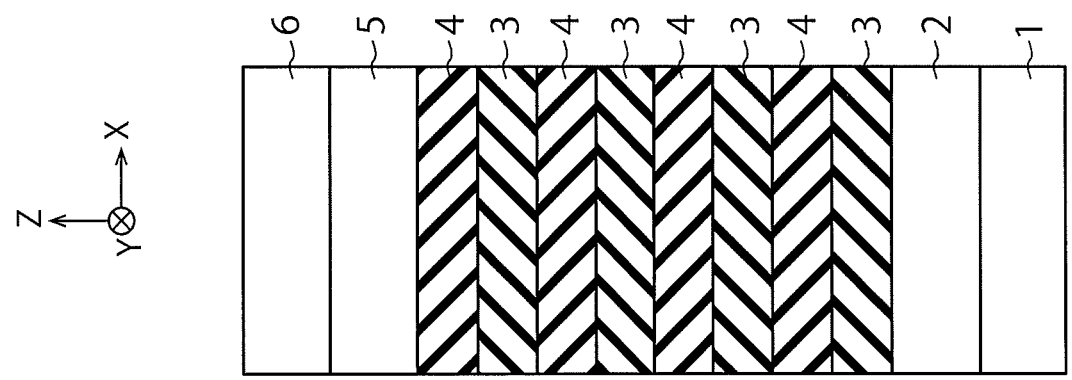

FIGS. 1A to 1C are cross-sectional views illustrating a method of manufacturing a semiconductor device of a first embodiment. An example of the semiconductor device of this embodiment is a three-dimensional memory.

First, a lower layer 2 is formed on a substrate 1, and a film stack that alternately includes a plurality of sacrificial layers 3 and a plurality of insulating layers 4 is formed on the lower layer 2 (FIG. 1A). Next, an upper layer 5 is formed on this film stack, and a mask layer 6 is formed on the upper layer 5 (FIG. 1A).

Examples of the substrate 1 include a semiconductor substrate, such as a silicon (Si) substrate. FIG. 1A illustrates an X direction and a Y direction that are parallel to a surface of the substrate 1 and are perpendicular to each other, and a Z direction that is perpendicular to the surface of the substrate 1. In the present disclosure, the +Z direction is set as an upward direction, and the −Z direction is set as a downward direction. The −Z direction may or may not coincide with the direction of gravity.

Examples of the lower layer 2 include insulators such as a silicon oxide film ($SiO_2$) and a silicon nitride film (SiN), and conductive layers formed between insulators. The sacrificial layers 3 are silicon nitride films, and the insulating layers 4 are silicon oxide films, for example. Examples of the upper layer 5 include insulators such as silicon oxide films and silicon nitride films and conductive layers formed between insulators. Examples of the mask layer 6 include an organic hard mask layer.

Next, an opening pattern for forming a memory hole M is formed in the mask layer 6 through lithography and dry etching (FIG. 1B). Then, the memory hole M that penetrates the upper layer 5, the plurality of insulating layers 4, the plurality of sacrificial layers 3, and the lower layer 2 is formed through dry etching using the mask layer 6 (FIG. 1B). After that, the mask layer 6 is removed.

Next, a block insulator 11, a charge storage layer 12, and a tunnel insulator 13 are formed in sequence in the memory hole M (FIG. 1C). The block insulator 11 is an example of a first insulator, and the tunnel insulator 13 is an example of a second insulator. Then, the block insulator 11, the charge storage layer 12, and the tunnel insulator 13 are removed from the bottom of the memory hole M, and a channel semiconductor layer 14 and a core insulator 15 are formed in the memory hole M in sequence (FIG. 1C). The charge storage layer 12 is a silicon nitride film, for example. The channel semiconductor layer 14 is a polysilicon layer, for example. Examples of the block insulator 11, the tunnel insulator 13, and the core insulator 15 include silicon oxide films and metal insulators.

After that, the sacrificial layers 3 are removed to form a plurality of cavities between each insulating layer 4, and a plurality of electrode layers are formed in the cavities. This process will be described in detail later. Furthermore, various plugs, lines, inter layer dielectrics, and the like are formed on the substrate 1. In this way, the semiconductor device of this embodiment is manufactured.

Figure 2:
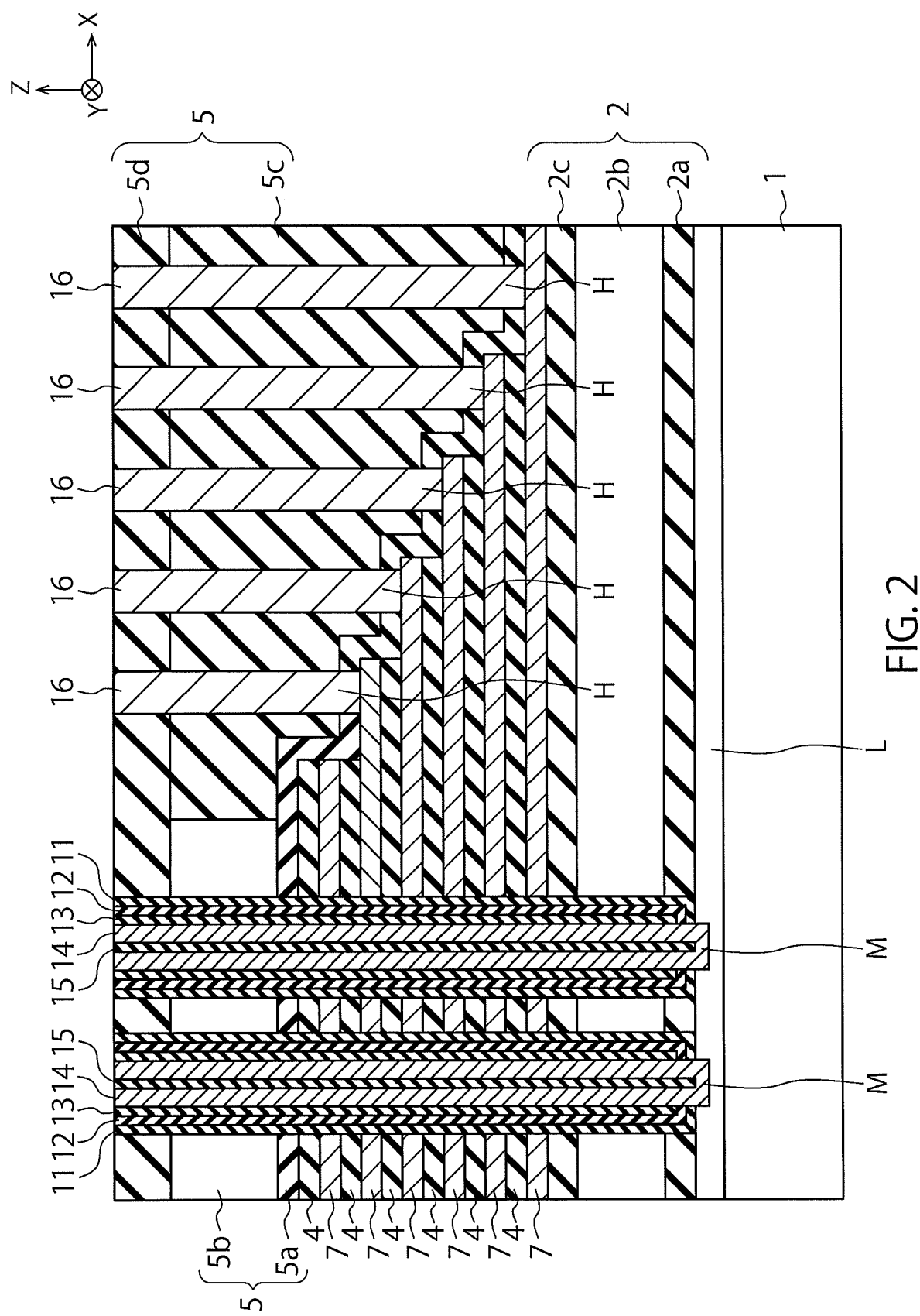
FIG. 2 is a cross-sectional view illustrating a structure of the semiconductor device of the first embodiment.

FIG. 2 is a cross-sectional view illustrating the structure of the semiconductor device of the first embodiment.

FIG. 2 illustrates an example of the semiconductor device manufactured by the method of this embodiment. In FIG. 2, memory cell units and a stepped contact portion of a three-dimensional memory are shown. In FIG. 2, the lower layer 2 is formed of a first lower insulator 2a, a source-side conductive layer (selection gate) 2b, and a second lower insulator 2c, and the upper layer 5 is formed of a cover insulator 5a, a drain-side conductive layer (selection gate) 5b, a first inter layer dielectric 5c, and a second inter layer dielectric 5d. The cover insulator 5a may not be provided. Each channel semiconductor layer 14 is electrically connected to a diffusion layer L in the substrate 1. Each of the sacrificial layers 3 is replaced with an electrode layer 7 including a tungsten (W) layer and the like.

FIG. 2 further illustrates contact plugs 16 formed in the respective contact holes H of the upper layer 5. Each contact plug 16 is formed in such a manner to be electrically connected to the corresponding electrode layer 7.

FIGS. 3A to 4C are cross-sectional views illustrating the method of manufacturing the semiconductor device of the first embodiment. The process for replacing the sacrificial layers 3 with the respective electrode layers 7 is described below.

Figure 3A:
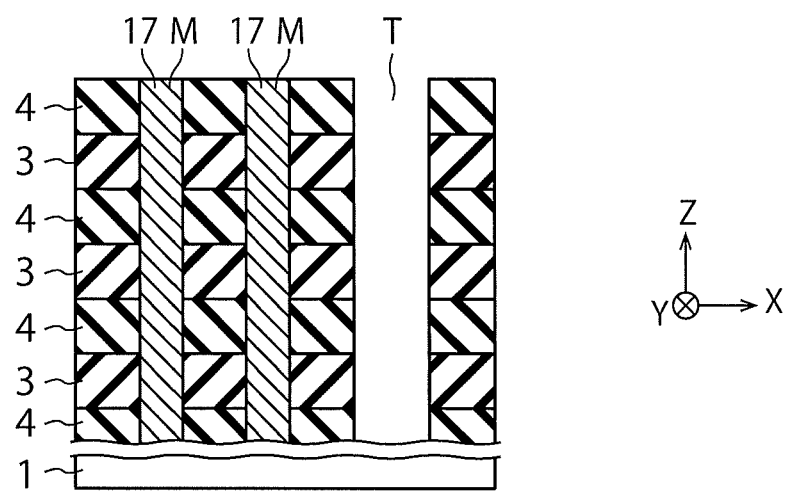
FIGS. 3A to 4C are cross-sectional views illustrating the method of manufacturing the semiconductor device of the first embodiment.

First, in the processes of FIGS. 1A to 1C, a columnar portion 17 that includes the block insulator 11, the charge storage layer 12, the tunnel insulator 13, the channel semiconductor layer 14, and the core insulator 15 is formed in each memory hole M (FIG. 3A). Next, an isolation trench T passing through the film stack including the plurality of sacrificial layers 3 and the plurality of insulating layers 4 and extending in the Y direction is formed (FIG. 3A).

Figure 3B:
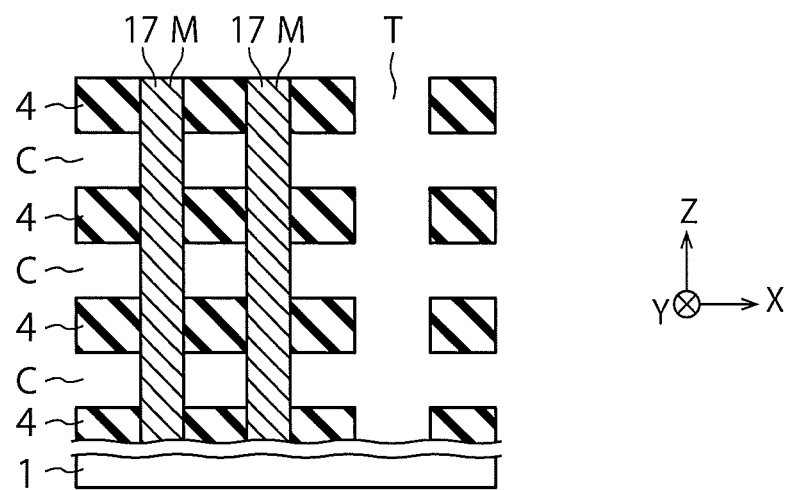

Then, these sacrificial layers 3 are selectively removed from the isolation trench T by wet etching with hydrofluoric acid (FIG. 3B). As a Consequence, a plurality of cavities C are formed between each insulating layer 4, thereby exposing the upper surface and lower surface of each insulating layer 4 and the side surfaces of each columnar portion 17 (block insulator 11) to the cavities C.

Figure 3C:
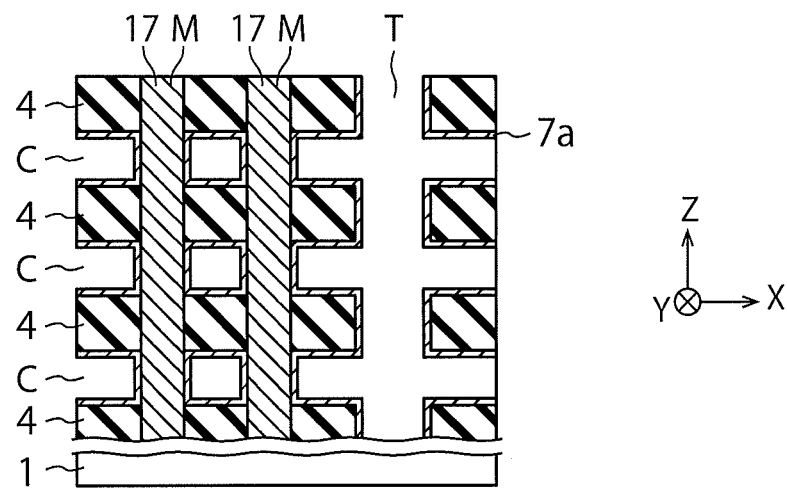

Sequentially, a barrier metal layer 7a forming the electrode layers 7 is formed conformally on the entire surface of the substrate 1 by CVD (Chemical Vapor Deposition) (FIG. 3C). As a consequence, the barrier metal layer 7a is formed on the surfaces of the insulating layers 4 and the columnar portions 17 in the cavities C and the isolation trench T. Examples of the barrier metal layer 7a include a titanium nitride film (TiN).

Figure 4A:
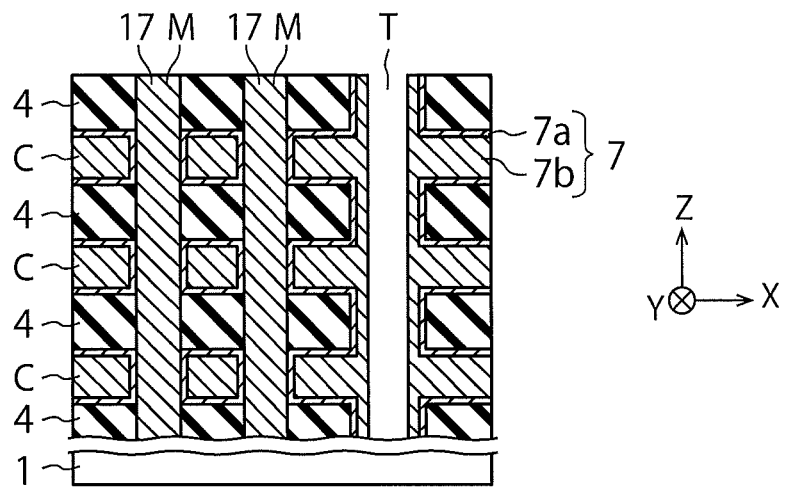

Next, electrode material layers 7b forming the electrode layers 7 is formed conformally on the entire surface of the substrate 1 by CVD (FIG. 4A). As a consequence, the electrode material layers 7b are embedded in the cavities C via the barrier metal layer 7a and are formed on the surfaces of the insulating layers 4 in the isolation trench T. Examples of the electrode material layers 7b include a tungsten (W) layer.

Here, a coefficient of linear expansion of the W layer forming the electrode material layers 7b is smaller than a coefficient of linear expansion of $SiO_2$ films forming the insulating layers 4. For this reason, the substrate 1 may be warped into a downwardly convex shape (tensile direction) after the electrode material layers 7b are formed. In this case, the substrate (wafer) 1 may not be able to flow. The substrate 1 has a tendency to warp more greatly as the number of the layers of the electrode material layers 7b is increased.

Figure 4B:
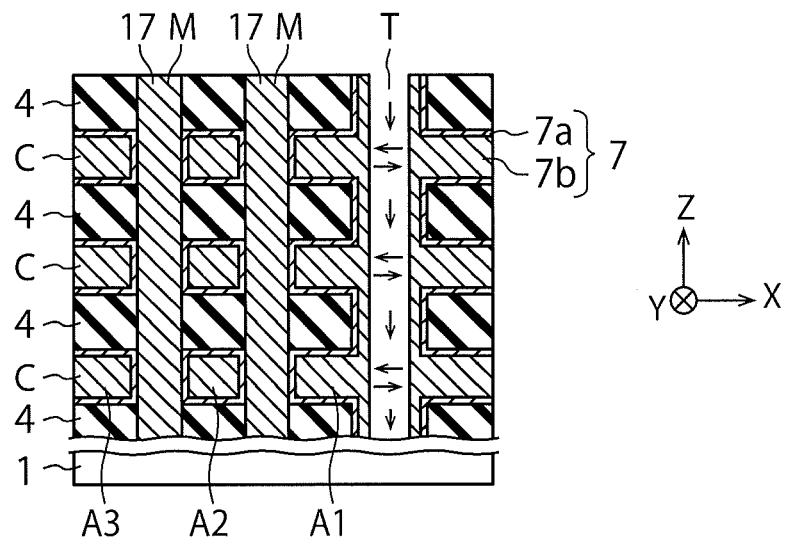

In this embodiment, impurity atoms are therefore introduced into each electrode material layer 7b from its surface after the electrode material layers 7b are formed (FIG. 4B). Consequently, the electrode material layers 7b are formed as impurity metal layers that contain W atoms as metal atoms and further contain impurity atoms different from the metal atoms. The average concentration of the impurity atoms in each electrode material layer 7b of this embodiment is, for example, $1.0 \times 10^{20}$ to $5.0 \times 10^{22}$ atoms/cm$^3$. Examples of the impurity atoms include Si (silicon) atoms, B (boron) atoms, and N (nitrogen) atoms.

According to this embodiment, lattice spacing between W atoms in the electrode material layers 7b can be increased by introducing the impurity atoms into the electrode material layers 7b. This makes it possible to return the direction of the stress applied to the substrate 1 back to a direction causing the substrate 1 to warp into an upwardly convex shape (compressive direction), from a direction causing the substrate 1 to warp into a downwardly convex shape (tensile direction), so that the stress can be brought close to zero. As a result, the warp of the substrate 1 can be suppressed.

Here, a value of the lattice spacing between W atoms in the electrode material layers 7b before introducing the impurity atoms is referred to as a first value, and a value of the lattice spacing between W atoms in the electrode material layers 7b after introducing the impurity atoms is referred to as a second value. In this embodiment, each electrode material layer 7b before introducing the impurity atoms is a W layer formed of an elemental substance of W atoms (elemental W layer), and the first value is 0.2236 nm (note that, this value is obtained when W (110) surface of the W layer is used). On the other hand, each electrode material layer 7b after introducing the impurity atoms is a W layer containing the impurity atoms, and the second value is greater than 0.2236 nm.

The metal atoms forming the electrode material layers 7b may be atoms other than W atoms. In addition, the impurity atoms introduced into the electrode material layers 7b may be atoms other that the aforementioned ones, as long as the lattice spacing between W atoms in the electrode material layers 7b can be increased.

Figure 4C:
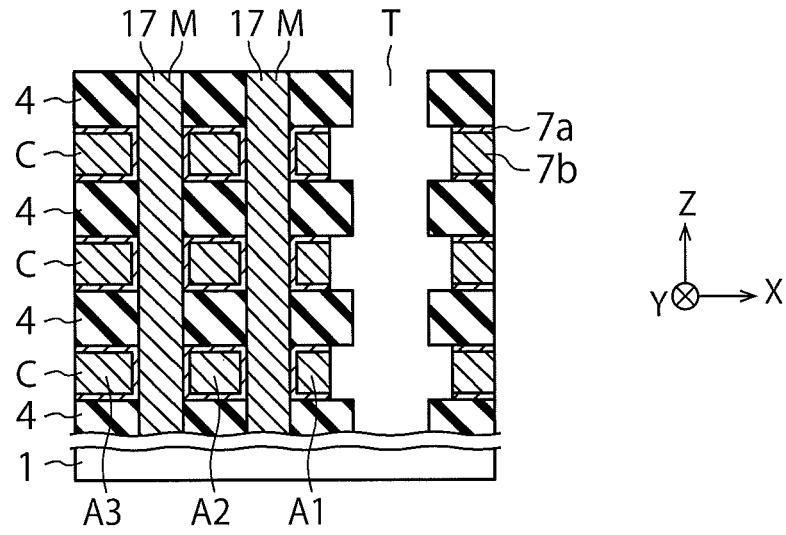

Then, the barrier metal layer 7a and the electrode material layers 7b are partially removed through etching (FIG. 4C). As a consequence, the barrier metal layer 7a and the electrode material layers 7b in the isolation trench T and part of the barrier metal layer 7a and part of the electrode material layers 7b in the cavities C are removed through etching.

After that, an insulator is embedded in the isolation trench T, and thereby the region of this insulator serves as an isolation region. The isolation region is provided apart from the columnar portions 17 (block insulators 11). Further, various plugs, lines, inter layer dielectrics, and the like are formed on the substrate 1. In this way, the semiconductor device of this embodiment is manufactured.

In FIG. 4B, a part of electrode material layer 7b includes a first portion A1 located close to the isolation trench T, a second portion A2 located apart from the isolation trench T, and a third portion A3 located further apart from the isolation trench T. The impurity atoms of this embodiment are introduced into each electrode material layer 7b from the surface of the electrode material layer 7b exposed into the isolation trench T, and therefore the concentration of the impurity atoms in the electrode material layer 7b decreases as the distance from the isolation trench T increases. Consequently, in the semiconductor device of this embodiment, each electrode material layer 7b includes the impurity atoms such that the electrode material layer 7b has a concentration gradient of the impurity atoms, and the concentration of the impurity atoms decreases as the distance from the isolation region increases.

Specifically, the first portion A1 has a high concentration of the impurity atoms, the second portion A2 has a low concentration of the impurity atoms, and the third portion A3 has an even lower concentration of the impurity atoms. As for the local concentration of the impurity atoms in each electrode material layer 7b, the minimum value of the local concentration is about $1.0 \times 10^{20}$ atoms/cm$^3$ and the maximum value of the local concentration is about $5.0 \times 10^{22}$ atoms/cm$^3$. Accordingly, the impurity atom concentration in the first portion A1 in this case is about $5.0 \times 10^{22}$ atoms/cm$^3$.

Owing to such a concentration gradient, a region containing a high concentration of the impurity atoms can be restricted within a vicinity of the isolation trench T. If the electrode material layers 7b contain a high concentration of the impurity atoms, an increase in resistance of the electrode material layers 7b could be a problem. According to this embodiment, such a concentration gradient narrows the region containing a high concentration of the impurity atoms, thereby achieving both suppression of the warp of the substrate 1 and reduction of the resistance of the electrode material layers 7b. The experimental results show that the resistance of the electrode material layers 7b after introducing the impurity atoms in this embodiment can be suppressed to be less than or equal to 1.1 times the resistance of the electrode material layers 7b before introducing the impurity atoms.

Figure 5:
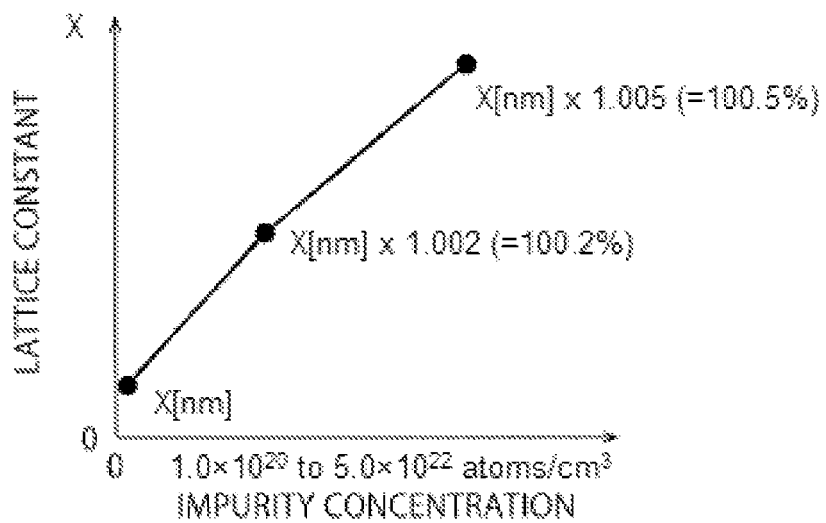
FIG. 5 illustrates a graph regarding a nitrogen concentration in electrode material layers of the first embodiment.

FIG. 5 illustrates a graph regarding an impurity concentration in electrode material layers 7b of the first embodiment.

In FIG. 5, the impurity concentration in the electrode material layers 7b is plotted on the horizontal axis, and the lattice spacing between W atoms (lattice constant) in the electrode material layers 7b is plotted on the vertical axis. The value on the vertical axis when the impurity concentration is zero is the lattice constant of tungsten. According to FIG. 5, it is understood that the lattice spacing between W atoms in the electrode material layers 7b increases as the impurity concentration increases.

Figure 6:
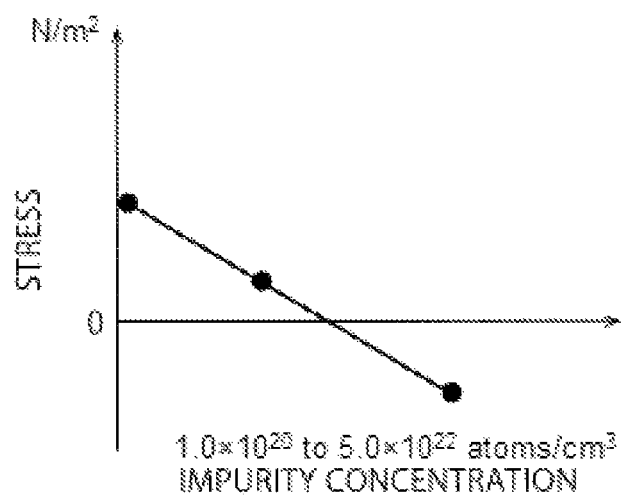
FIG. 6 illustrates another graph regarding the nitrogen concentration in the electrode material layers of the first embodiment.

FIG. 6 illustrates another graph regarding an impurity concentration in the electrode material layers 7b of the first embodiment.

In FIG. 6, the impurity concentration in the electrode material layers 7b is plotted on the horizontal axis, and the stress applied to the substrate 1 is plotted on the vertical axis. According to FIG. 6, it is understood that the stress can be brought close to zero by adjusting the impurity concentration to an appropriate value. For this reason, in the process shown in FIG. 4B of this embodiment, the impurity atoms are introduced into the electrode material layers 7b.

For example, in the process shown in FIG. 4B of this embodiment, the impurity atoms are introduced into the electrode material layers 7b by annealing the electrode material layers 7b using gas containing the impurity atoms. Examples of this gas include ammonia (NH$_3$) gas. In this case, it is considered that active N atoms originated from NH$_3$ molecules enter the electrode material layers 7b. Alternatively, when Si atoms are introduced into the electrode material layers 7b, silane gas may be used as the annealing gas. Alternatively, when B atoms are introduced into the electrode material layers 7b, borane gas may be used as the annealing gas.

The annealing temperature for the electrode material layers 7b is preferably 300 to 900° C., for example. This is because the impurity atoms are hardly introduced into the electrode material layers 7b at a temperature lower than 300° C. and a temperature higher than 900° C. is too high for the annealing temperature.

Figure 7:
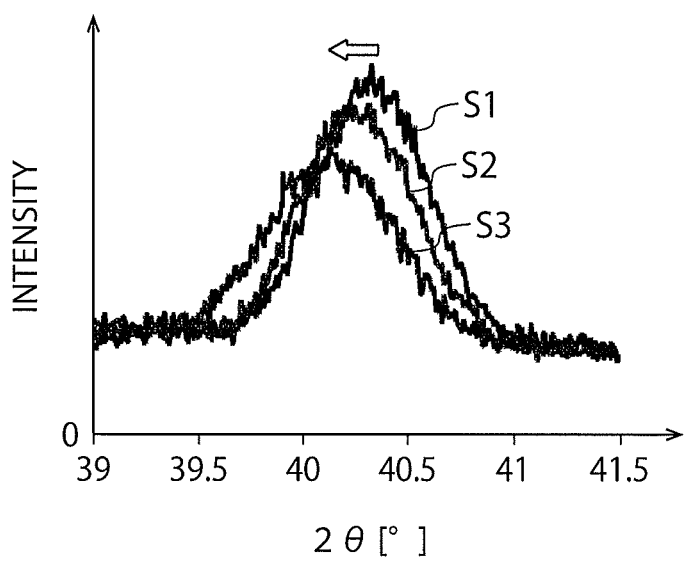
FIG. 7 illustrates a graph regarding an X-ray diffraction measurement of the electrode material layers of the first embodiment.

FIG. 7 illustrates a graph regarding an X-ray diffraction measurement of the electrode material layers 7b of the first embodiment.

In FIG. 7, the angle (2θ) and intensity of scattered X-rays obtained by irradiating the electrode material layers 7b with X-rays are respectively plotted on the horizontal axis and the vertical axis. That is, FIG. 7 illustrates angular dependence of the intensity (intensity distribution) of the scattered X-rays.

A reference sign "S1" indicates the intensity distribution before annealing the electrode material layers 7b. A reference sign "S2" indicates the intensity distribution after annealing the electrode material layers 7b for a short time. A reference sign "S3" indicates the intensity distribution after annealing the electrode material layers 7b for a long time. The gas used for annealing is ammonia gas. The electrode material layers 7b are W layers, and specifically, W (110) surfaces of the W layers are used.

As shown with an arrow in FIG. 7, when annealing of the electrode material layers 7b is continued, peak angles of the intensity distributions decrease. This shows that the lattice spacing between W atoms in the electrode material layers 7b increases by annealing. This finding indicates that when the electrode material layers 7b are annealed using ammonia gas, the impurity atoms that have entered the electrode material layers 7b by annealing act to increase the lattice spacing between the W atoms in the electrode material layers 7b.

Figure 8:
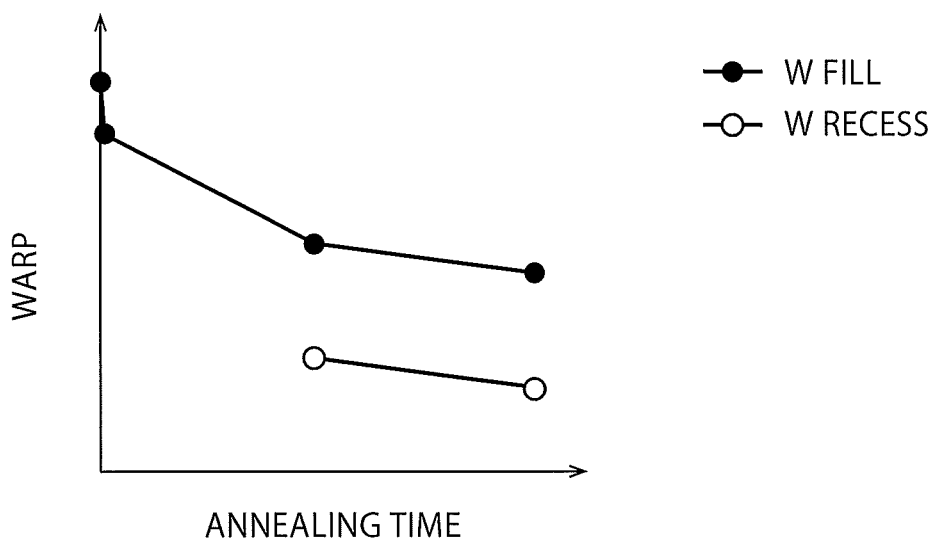
FIG. 8 illustrates a graph regarding annealing according to the electrode material layers of the first embodiment.

FIG. 8 illustrates a graph regarding annealing of the electrode material layers 7b of the first embodiment.

In FIG. 8, time for annealing the electrode material layers 7b is plotted on the horizontal axis, and degree of the warp of the substrate 1 is plotted on the vertical axis. The warp of the substrate 1 changes in a direction convex downward as the value on the vertical axis goes upward, and the warp of the substrate 1 changes in a direction convex upward as the value on the vertical axis goes downward.

Filled circles in FIG. 8 indicate the warp of the substrate 1 when the electrode material layers 7b having a shape shown in FIG. 4B is annealed. Open circles in FIG. 8 indicate the warp of the substrate 1 when the electrode material layers 7b are processed into a shape shown in FIG. 4C after annealing the electrode material layers 7b having the shape shown in FIG. 4B for annealing time of the filled circles. According to FIG. 8, it is understood that the warp of the substrate 1 changes in the direction convex upward as the annealing time increases in both the filled circles and the open circles. Therefore, the process shown in FIG. 4C may be performed in the middle of the annealing of the electrode material layers 7b.

As has been described above, in this embodiment, the lattice spacing between the metal atoms in the electrode material layers 7b are increased by introducing the impurity atoms into the electrode material layers 7b containing the metal atoms. Consequently, according to this embodiment, the warp of the substrate 1 due to the electrode material layers 7b can be suppressed.

Second Embodiment

FIGS. 9A to 9C are cross-sectional views illustrating a method of manufacturing a semiconductor device of a second embodiment. The method is performed to form each contact plug 16 shown in FIG. 2.

First, in the processes of FIGS. 3A to 4C, a film stack that alternately includes the plurality of electrode layers 7 and the plurality of insulating layers 4 is formed on the substrate 1. In FIG. 9A illustrates one of the electrode layers 7 in the film stack and the upper layer 5 on the electrode layer 7.

Next, the contact hole H passing through the upper layer 5 and reaching the electrode layer 7 is formed (FIG. 9A).

Then, a barrier metal layer 16a forming the contact plug 16 is formed conformally on the entire surface of the substrate 1 by CVD (FIG. 9B). As a consequence, the barrier metal layer 16a is formed on the electrode layer 7 in the contact hole H and the surface of the upper layer 5. Examples of the barrier metal layer 16a include a TiN film.

Sequentially, a plug material layer 16b forming the contact plug 16 is formed conformally on the entire surface of the substrate 1 by CVD (FIG. 9B). As a consequence, the plug material layer 16b is embedded in the contact hole H via the barrier metal layer 16a. Examples of the plug material layer 16b include a W layer.

Next, N atoms as the impurity atoms are introduced into the plug material layer 16b from the surface of the plug material layer 16b (FIG. 9C). As a consequence, the plug material layer 16b is formed as an impurity metal layer containing W atoms as metal atoms, and further containing impurity atoms different from the metal atoms. The average concentration of the impurity atoms in the plug material layer 16b of this embodiment is, for example, $1.0 \times 10^{20}$ to $5.0 \times 10^{22}$ atoms/cm$^3$.

According to this embodiment, lattice spacing between W atoms in the plug material layer 16b can be increased by introducing the impurity atoms into the plug material layer 16b. This makes it possible to return the direction of the stress applied to the substrate 1 back to a direction causing the substrate 1 to warp into an upwardly convex shape (compressive direction), from a direction causing the substrate 1 to warp into a downwardly convex shape (tensile direction), so that the stress can be brought close to zero. As a result, the warp of the substrate 1 can be suppressed. The stress applied to the substrate 1 may approach a value greater than zero (positive value), instead of approaching zero. The details of the metal atoms and the impurity atoms in the plug material layer 16b of this embodiment are the same as the details of the metal atoms and the impurity atoms in the electrode material layers 7b of the first embodiment.

After that, the surfaces of the barrier metal layer 16a and the plug material layer 16b are polished by CMP (Chemical Mechanical Polishing), thereby removing portions of the barrier metal layer 16a and the plug material layer 16b located outside the contact hole H. The CMP may however be performed before introducing the impurity atoms into the plug material layer 16b. Furthermore, various plugs, lines, inter layer dielectrics, and the like are formed on the substrate 1. In this way, the semiconductor device illustrated in FIG. 2 is manufactured.

The impurity atoms of this embodiment are introduced into the plug material layer 16b from the upper surface of the plug material layer 16b, and therefore the concentration of the impurity atoms in the plug material layer 16b decreases as the distance from the upper surface of the plug material layer 16b increases. Consequently, in the semiconductor device illustrated in FIG. 2, the plug material layer 16b of each contact plug 16 includes the impurity atoms such that the plug material layer 16b has a concentration gradient of the impurity atoms, and the concentration of the impurity atoms decreases as the distance from the upper surface of the plug material layer 16b increases. In the plug material layer 16b of each contact plug 16, a portion that has the highest concentration of the impurity atoms is located at the upper surface of the plug material layer 16b.

As for the local concentration of the impurity atoms in each plug material layer 16b, the minimum value of the local concentration is about $1.0 \times 10^{20}$ atoms/cm$^3$ and the maximum value of the local concentration is about $5.0 \times 10^{22}$ atoms/cm$^3$.

Owing to such a concentration gradient, a region containing a high concentration of the impurity atoms can be restricted within a vicinity of the upper surface of the plug material layer 16b. If the plug material layer 16b contains a high concentration of the impurity atoms, an increase in resistance of the plug material layer 16b could be a problem. According to this embodiment, such a concentration gradient narrows the region containing a high concentration of the impurity atoms, thereby achieving both suppression of the warp of the substrate 1 and reduction of the resistance of the plug material layer 16b.

FIGS. 10A to 10C are cross-sectional views illustrating a method of manufacturing a semiconductor device of a modification of the second embodiment.

In this modification, processes in FIGS. 9A and 9B are replaced with a process in FIG. 10A. Specifically, a plug material layer 16b of this modification is formed so as not to completely fill the contact hole H. Next, N atoms as the impurity atoms are introduced into the plug material layer 16b from the surface of the plug material layer 16b (FIG. 10B). Then, another plug material layer 16c forming the contact plug 16 is formed conformally on the entire surface of the substrate 1 by CVD (FIG. 10C). As a consequence, the plug material layer 16c is embedded in the contact hole H via the barrier metal layer 16a and the plug material layer 16b. Examples of the plug material layer 16c include a W layer. After that, the impurity atoms are introduced into the plug material layer 16c from the surface of the plug material layer 16c. Examples of the impurity atoms are the same as in the first embodiment.

The size of each contact plug 16 is typically smaller than the size of each electrode layer 7. For this reason, only a small amount of the impurity atoms can be introduced into each contact plug 16, which may result in unsatisfactory suppression of the warp of the substrate 1. Therefore, each contact plug 16 is formed of a plurality of plug material layers as in this modification, and the impurity atoms are introduced into each plug material layer, so that the impurity atoms introduced into each contact plug can be increased. As a result, the warp of the substrate 1 can be satisfactorily suppressed.

As has been described above, in this embodiment, the lattice spacing between the metal atoms in the plug material layer 16b can be increased by introducing the impurity atoms into the plug material layer 16b containing the metal atoms. Consequently, according to this embodiment, the warp of the substrate 1 due to the plug material layer 16b can be suppressed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:
1. A semiconductor device comprising:
a substrate;
a plurality of insulating layers provided on the substrate;

a plurality of electrode layers provided on the substrate alternately with the plurality of insulating layers and including metal atoms and impurity atoms different from the metal atoms, lattice spacing between the metal atoms in the electrode layers being greater than lattice spacing between the metal atoms in an elemental substance of the metal atoms;

first and second columnar portions, each of which including a first insulator, a charge storage layer, a second insulator and a semiconductor layer that are provided in sequence in the insulating layers and the electrode layers; and an isolation region provided apart from the first and second columnar portions in the insulating layers and the electrode layers, wherein a distance between the second portion and the isolation region is greater than a distance between the first portion and the isolation region, and a concentration of the impurity atoms in the electrode layers between the second columnar portion and the first columnar portion is smaller than a concentration of the impurity atoms in the electrode layers between the first columnar portion and the isolation region.

2. The device of claim 1, wherein the metal atoms include tungsten atoms, and the impurity atoms include silicon atoms, boron atoms or nitrogen atoms.

3. The device of claim 1, wherein the electrode layers include the impurity atoms such that the electrode layers have a concentration gradient of the impurity atoms.

4. The device of claim 1, wherein a concentration of the impurity atoms in the electrode layers decreases as a distance from the isolation region increases.

* * * * *